US009981471B2

(12) United States Patent
Porro

(10) Patent No.: US 9,981,471 B2
(45) Date of Patent: May 29, 2018

(54) METHOD FOR THE SURFACE TREATMENT OF A SEMICONDUCTOR SUBSTRATE

(71) Applicant: STMicroelectronics S.R.L., Agrate Brianza (IT)

(72) Inventor: Fabrizio Porro, Portici (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days. days.

(21) Appl. No.: 15/176,876

(22) Filed: Jun. 8, 2016

(65) Prior Publication Data

US 2017/0182768 A1 Jun. 29, 2017

(30) Foreign Application Priority Data

Dec. 28, 2015 (IT) ........................ 102015000088126

(51) Int. Cl.
*H01L 21/00* (2006.01)
*B41J 2/14* (2006.01)
*B41J 2/16* (2006.01)

(52) U.S. Cl.
CPC ............. *B41J 2/1433* (2013.01); *B41J 2/162* (2013.01); *B41J 2/164* (2013.01); *B41J 2/1606* (2013.01)

(58) Field of Classification Search
CPC ........ B41J 2/1433; B41J 2/1606; B41J 2/162; B41J 2/164
USPC ........................................................... 438/21
See application file for complete search history.

(56) References Cited

U.S. PATENT DOCUMENTS 5,512,131 A * 4/1996 Kumar .................. B05D 1/283 216/13
6,074,040 A * 6/2000 Usui .................... B41J 2/14233 347/45
6,325,490 B1 12/2001 Yang et al.
6,420,253 B2 7/2002 Appelt et al.
2002/0097297 A1 7/2002 Skinner et al.
2009/0298296 A1* 12/2009 Burdinski .............. B82Y 10/00 438/758
2011/0050803 A1* 3/2011 Wu ........................ B41J 2/1433 347/44

(Continued)

FOREIGN PATENT DOCUMENTS

EP 1 157 842 A1 11/2001
WO 2014/080575 A1 5/2014

OTHER PUBLICATIONS

Italian Search Report and Written Opinion, dated Sep. 1, 2016, for Italian Application No. UB20159489, 8 pages.

*Primary Examiner* — Whitney T Moore
*Assistant Examiner* — Herve Assouman
(74) *Attorney, Agent, or Firm* — Seed IP Law Group LLP

(57) ABSTRACT

The present disclosure relates to a method for the application of an antiwetting coating on at least one surface of a substrate of semiconductor material comprising the steps of: a) applying on said at least one surface a metal layer of a material chosen in the group constituted by noble metals, coining metals, their oxides and their alloys; and b) applying on said metal layer a layer of a thiol of formula R—SH, where R is a linear alkyl chain having from 3 to 20 carbon atoms and, optionally, at least one hetero-atom, for obtaining an antiwetting coating. The disclosure further regards a method for the production of a nozzle plate for ink-jet printing and to an integrated ink-jet printhead provided with a nozzle plate obtained according to the method of the disclosure.

10 Claims, 3 Drawing Sheets

(56) References Cited

U.S. PATENT DOCUMENTS

2011/0228011 A1* 9/2011 Kyoso .................. B41J 2/04541
347/68

* cited by examiner

METHOD FOR THE SURFACE TREATMENT OF A SEMICONDUCTOR SUBSTRATE

BACKGROUND

Technical Field

The present disclosure relates to a method for the surface treatment of a substrate of semiconductor material, in particular of a nozzle plate for ink-jet printers, and more specifically to a process for application of a chemically stable antiwetting coating confined on the surface of said nozzles.

Description of the Related Art

In numerous applications, it is necessary to apply a water-repellent and/or oil-repellent coating on surfaces exposed to liquids. In the case of ink-jet printheads, for example, it is necessary to apply an antiwetting coating (AWC) on the printing nozzle plate to prevent formation of ink residue during and after ink-jet printing. In fact, the accumulation of residue around the orifice of the nozzle from which the drops of ink are expelled may alter the direction of the drop, thus causing a degradation of the quality of the printed images.

The antiwetting treatment must further be applied only on the outside the orifice of the nozzles to prevent the printing resolution from being affected and must be chemically stable if it is arranged in contact with acidic or basic solutions, as are many water-based inks, which would otherwise destroy the AWC in a short time.

The antiwetting treatment of surfaces such as silicon, glass, or other inorganic or organic substrates, may be obtained by depositing an antiwetting polymeric layer by lamination, spin coating, or chemical vapor deposition (CVD).

These treatments may offer good surface properties and excellent chemical stability, but are frequently unstable to delamination from the substrate when they are arranged in contact with the liquids. This phenomenon is due to the weak interaction of a physical type that binds together the deposited layer and the substrate. These physical interactions are in general due to hydrogen bonds or Van der Waals forces. Further, these deposition techniques may cause the AWC to be applied inside the orifice of the nozzle, thus causing alteration of the printing process.

Alternatively, an antiwetting treatment may be obtained through a coating of a chemical type by creating chemical bonds, which are stronger than physical bonds. Typically, this coating is obtained with the use of molecules such as alkyl silanes, perfuoro alkylsilanes, chlorosilanes, or alkoxy silanes.

On the silicon surfaces, for example, alkyl silanes form a uniform monolayer (with a thickness ranging from a few Angstrom to hundreds of nanometers) chemically bound to the silicon surface through a Si—O—Si bond.

The above coatings are not subject to delamination and make it possible to obtain the desired surface properties through an appropriate choice of the alkyl tail. This type of coating is, however, known to be unstable when exposed to aqueous environments, as many water-based inks. In particular, the Si—O—Si anchorage bonds are unstable in aqueous environments, above all if at a non-neutral pH.

BRIEF SUMMARY

Certain embodiments of the present disclosure provide a method for the application of an antiwetting coating that will be free from the known disadvantages and that in particular will not undergo physical and/or chemical degradation over time and when arranged in contact with acidic or basic aqueous solutions, and that will enable application of the coating in confined areas of the nozzle plate.

In particular, the present disclosure provides a method comprising:

a) applying, on at least one surface of a semiconductor material substrate, a metal layer of a material selected from the group consisting of noble metals, coining metals, oxides thereof and alloys thereof; and b) forming an antiwetting coating by applying on said metal layer a layer of a thiol of formula R—SH, where R is a linear alkyl chain having from 3 to 20 carbon atoms and, optionally, at least one hetero-atom.

BRIEF DESCRIPTION OF THE SEVERAL VIEWS OF THE DRAWINGS

The present disclosure will now be described in detail with reference to the annexed drawings, wherein.

DETAILED DESCRIPTION

Figure 1A:
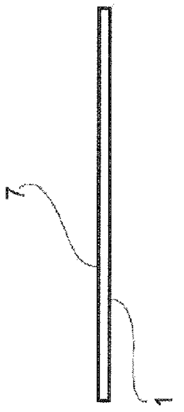
FIGS. 1A-1D are schematic illustrations of a first embodiment of the present method.

In particular, one embodiment provides a method for application of an antiwetting coating to at least one surface of a substrate of semiconductor material, said method comprising the steps of:

a) applying to said at least one surface a metal layer of a material selected from the group consisting of noble metals, coining metals, oxides thereof and alloys thereof; and b) forming an antiwetting coating by applying on said metal layer a layer of a thiol of formula R—SH, where R is a linear alkyl chain having from 3 to 20 carbon atoms and, optionally at least one hetero-atom.

In the present text, by the term "noble metals" are meant metal elements that have a poor tendency to combine or react with oxygen. In particular, examples of said class of elements are gold, silver, palladium, platinum, ruthenium, rhodium, osmium, iridium and their alloys.

In the present text, by the term "coining metals" are meant those metal elements that may be used as components in alloys used for coining. In particular, examples of these metals are copper, zinc, iron, tin, nickel, chromium, titanium, aluminum, antimony, and the metals of Group II of the Periodic Table and their alloys.

Examples of noble or coining metals, their oxides and their alloys according to the present description are silver, gold, copper, palladium, platinum, mercury, ruthenium, nickel, titanium, indium, zinc, their oxides and alloys, in particular, $TiO_2$ and indium tin oxide (ITO).

The present method is based upon the process of reaction between a noble or coining metal, or an oxide or alloy thereof with a thiol.

In particular, with the method described it is possible to create an antiwetting monolayer formed by the hydrocarbon chains of the thiol, characterized by a strong bond formed between the thiol (—SH) and the metal layer (e.g., the noble metal) on the substrate of semiconductor material. The antiwetting monolayer thus obtained is densely packed, with the hydrocarbon chains of the thiol that have an orientation that is inclined and orderly with respect to the surface of the substrate. Said monolayer prevents oxidation of the substrate and is stable in regard to acidic and basic solvents.

The present method further provides application, in a confined way on the substrate, of the antiwetting monolayer having appropriate chemical stability. For instance, in the case of application on an ink-jet printhead, unlike the methods known in the art, the present method enables confinement of application of the antiwetting layer only around the orifices of the nozzles, without involving or contacting the openings through which the ink is expelled.

Finally, the present method enables a simple adaptability to mass-production processes.

For instance, the substrate of semiconductor material is a silicon substrate. In particular, the substrate of semiconductor material may be a nozzle plate for ink-jet printing, as described hereinafter with reference to FIG. 2.

The thiol used is a compound of formula R—SH, where R is a linear alkyl chain containing from 3 to 20 carbon atoms, in particular from 8 to 20 carbon atoms. An example of thiols that may be used is dodecanethiol.

The hydrocarbon chain of the thiol may further contain hetero-atoms or be functionalized to bestow upon the surface on which it is applied the desired chemical properties.

Application of the metal layer may be carried out by evaporation or sputtering according to methods known in the art. In the tests conducted thermal evaporation in a vacuum has been used for depositing gold on the surface of the substrate.

By way of example, a layer of gold 20 nm thick may be deposited by thermal evaporation at $10^{-6}$ mbar and at a rate of 0.5 nm/s.

Application of the layer of thiol is carried out by dipping the substrate of semiconductor material provided with the metal layer in a solution of thiol, in particular in an ethanol solution of thiol. Alternatively, the thiol may be deposited using CVD techniques.

The present method will now be described with reference to FIGS. 1A-1D, which illustrate steps according to one embodiment of the method.

As illustrated in FIG. 1A, the substrate 1 is of semiconductor material, for example silicon, having a surface 7.

Figure 1B:
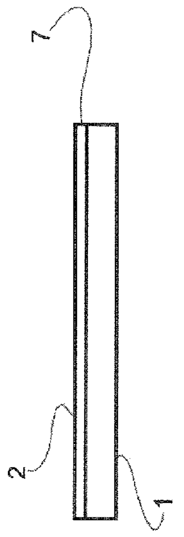
Figure 1C:
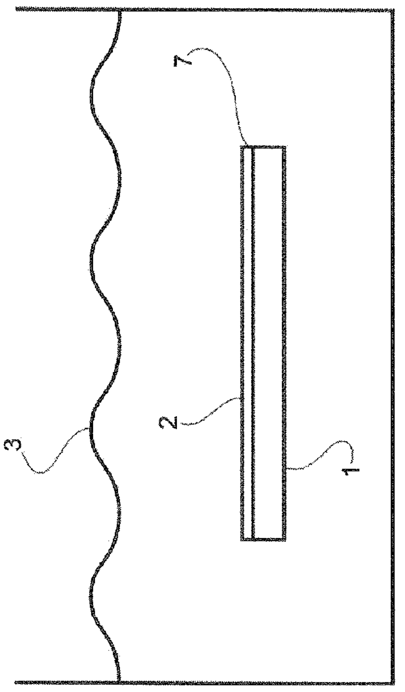

On the surface 7 of the substrate 1, a metal layer 2 of a noble metal, for example gold, is deposited using an evaporation technique (FIG. 1B).

After application of the metal layer 2, the substrate 1 thus obtained (FIG. 1C) is dipped in a solution of a thiol 3, for example an ethanol solution of dodecanethiol, for a time ranging from 10 s to 8 h.

Figure 1D:
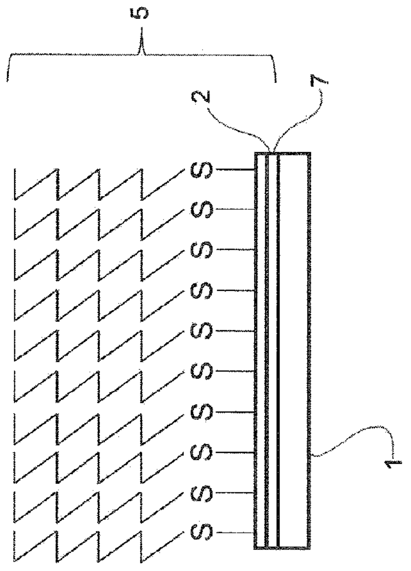

In this way, as illustrated in FIG. 1D, the antiwetting layer 5 is fixed, i.e., chemically associated, to the surface 7 of the substrate 4.

In another embodiment, illustrated in FIGS. 2A-2E, the substrate 11 is a nozzle plate for ink-jet printing.

Figures 2A, 2B, 2C, 2D, 2E:
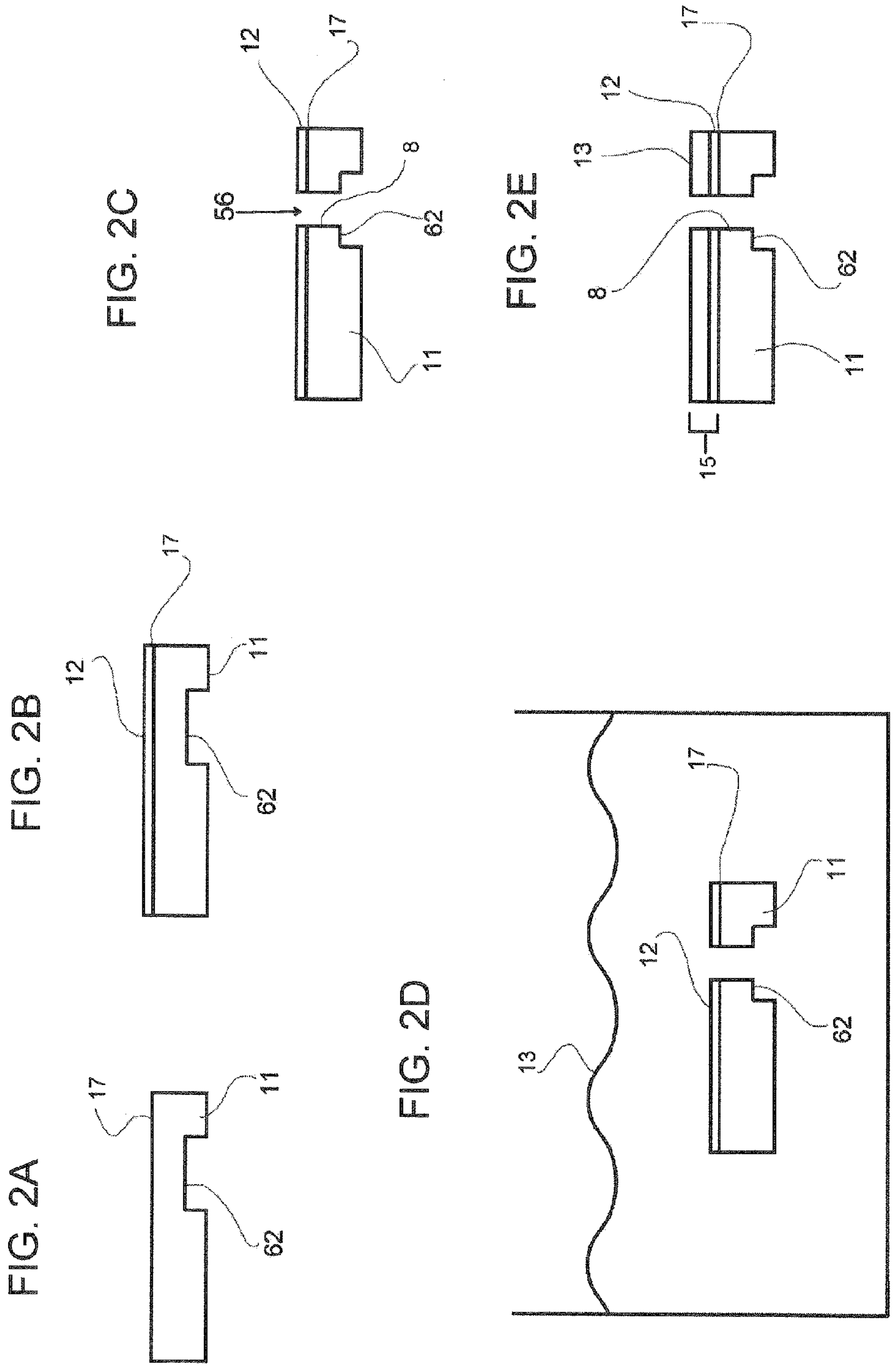
FIGS. 2A-2E are schematic illustrations of a second embodiment of the present method.

As illustrated in FIG. 2A, the substrate 11 is of semiconductor material, for example silicon, having a surface 17. The substrate 11 is further provided with an outlet channel 62 for the ink.

On the surface 17 of the substrate 11 a metal layer 12 of a noble metal, for example gold, is then deposited using an evaporation technique (FIG. 2B).

After application of the metal layer 12, through openings 8 are made in the plate 11 in an area corresponding to the outlet channel 62 for the ink for obtaining the nozzles 56 (FIG. 2C).

The substrate 11 thus obtained (FIG. 2D) is dipped in a solution of a thiol 13, for example an ethanol solution of dodecanethiol, for a time ranging from 10 s to 8 h.

In this way, as illustrated in FIG. 2E, the antiwetting layer 15 is fixed, i.e., chemically associated, in a way confined exclusively on the metal layer 12, on the surface 17 of the substrate 11, and not in the nozzles 56.

This is made possible thanks to the selectivity of the reactivity of thiols in regard to gold, and not in regard to silicon.

The above method may be used for deposition of an antiwetting layer on a nozzle plate for an ink-jet printhead of any commercially available type.

According to a further embodiment, a nozzle plate of an ink-jet printhead is provided, which presents an antiwetting layer that is chemically stable and confined on a surface thereof.

Figure 3:
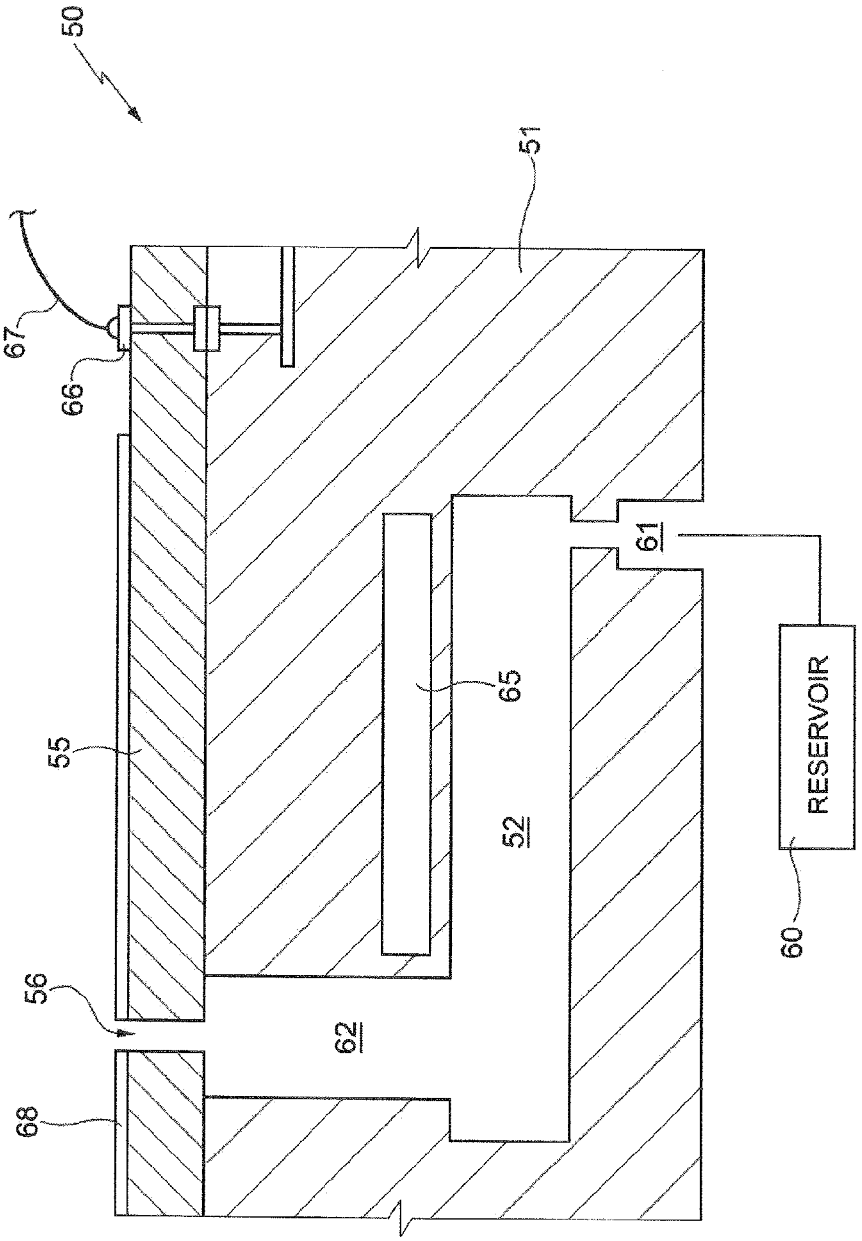
FIG. 3 shows a cross-section through an ink-jet printhead to which the present method may be applied.

With reference to FIG. 3, the head, designated as a whole by 50, comprises a body 51, made for example of silicon or glass, housing a chamber 52. A nozzle plate 55 extends over the body 51 and has at least one nozzle 56. Alternatively, the nozzle plate 55 may comprise a plurality of nozzles 56 (not illustrated), each connected to a different chamber 52. The chamber 52 is connected to an external reservoir 60 through an inlet channel 61 and to the nozzle 56 through an outlet channel 62. A membrane 65 extends on one side of the chamber 52 to push the liquid contained in the chamber 52 towards the nozzle 56. Valves (not shown) enable the desired movement of the liquid, here an ink.

The top surface of the nozzle plate 55 has an antiwetting layer 68, obtained with the method described with reference to FIGS. 1A-1D or 2A-2E.

Further characteristics of the present method will emerge from the ensuing description of some merely illustrative and non-limiting examples.

Example 1

Preparation of an Antiwetting Coating on a Substrate of Semiconductor Material The first step of the process consisted metallization of a silicon substrate of dimensions of 4 cm×4 cm.

In detail, a layer of gold 20 nm thick was deposited via thermal evaporation at a pressure of $10^{-6}$ mbar and a rate of 0.5 nm/s.

The substrate thus obtained was dipped for 30 s in a 0.8 mM solution of ethanol and dodecanethiol.

The substrate was then taken out of the solution and washed in pure ethanol to remove the thiol that had not reacted.

Example 2

Performance of the Antiwetting Substrate According to Example 1

The performance of a plate obtained according to the method illustrated in Example 1 was evaluated as regards its antiwettability.

Three identical plates (specimens 1-3) having dimensions 40×12 mm were each introduced into a vial containing a water-based ink and containing the cyan pigment having a pH comprised between 7 and 9.

Each plate was for two thirds immersed in the ink. The vials were then closed to prevent evaporation of the ink and set at a temperature of 60° C. for 7 days.

Next, the plates were removed from the vials and cleaned with demineralized water and then with 2-propanol. The plates were then dried.

The antiwettability of the plates thus obtained was evaluated by measuring the angle of contact of a drop of water deposited thereon. In particular, comparisons were made of the values of the angle of contact on the plate prior to application of the antiwetting layer according to the method described (Angle of contact prior to application of the layer of gold-thiols), of the angle of contact on the plate after application of the antiwetting layer according to the method described (Angle of contact after application of the layer of gold-thiols) and of the angle of contact on the plate after dipping in ink. A higher contact angle indicates higher antiwetting capability. The results obtained are presented in Table 1 below.

TABLE 1

| Specimen | Angle of contact prior to application of the layer of gold-thiols | Angle of contact after application of the layer of gold-thiols | Angle of contact after dipping in the ink |
|---|---|---|---|
| 1 | 16.3 ± 1.2 | 105.8 ± 1.2 | 96.2 ± 0.6 |
| 2 | 17.4 ± 0.3 | 107.2 ± 1.0 | 93.1 ± 1.3 |
| 3 | 18.2 ± 0.7 | 98.3 ± 2.0 | 86.7 ± 0.5 |

As may be noted, notwithstanding the fact that the plates were dipped in a particularly aggressive ink, the values of the angle of contact remained very high (90% of the values after application of the layer of gold-thiols), indicating the superior chemical resistance of the coating obtained with the method according to the disclosure.

Comparison with Silane-Based Coatings of the Prior Art

A plate according to Example 2 (specimen 1) was compared with plates that have a coating obtained by silanization, as is known from the prior art.

In particular, the following specimens were obtained, which present silane coatings:

Specimen 4: plate coated with PFOTS (1H,1H,2H,2H-perfluorooctyltrichlorosilane);

Specimen 5: plate coated with silane Fluorolink S10 (Solvay)

Specimen 6: plate coated with PTMS (propyltrimethoxysilane)

Also in this case, the antiwettability was evaluated by measuring the angle of contact of a drop of water deposited on the specimens. The results appear in Table 2.

TABLE 2

| | Specimen 1 | Specimen 4 | Specimen 5 | Specimen 6 |
|---|---|---|---|---|
| Prior to dipping in ink | 105.8 ± 1.2 | 108.7 ± 4.0 | 127.3 ± 2.6 | 103.0 ± 1.0 |
| After dipping in ink | 96.2 ± 0.6 | <10 | 12 | 10.0 |

It was further observed that after dipping in ink, Specimen 1 according to an embodiment of the present disclosure largely maintained the antiwetting capability (indicated by a slight reduction of the contact angle). In contrast, Specimens 4-6 exhibited much reduced contact angles after dipping ink. The results of Table 2 demonstrated that the antiwetting layer obtained with the method described, even though it presents an initial angle of contact comparable to that of the coatings of the prior art, proves much more stable after coming into contact with the ink.

Moreover, the method described enables application of the coating in an extremely confined way, unlike the dipping method.

Evaluation of the Selectivity of the Reactivity of the Thiols in Regard to Gold

To check that the thiols bonded in a selective way to a metal layer and not also to the silicon substrate, the following experiment was carried out.

Three silicon substrates (specimens 7-9) of dimensions 4×4 cm were dipped for 30 s in the 0.8 mM solution of ethanol and dodecanethiol.

The supports were then taken out of the solution and washed in pure ethanol.

Also in this case, the antiwettability was evaluated by measuring the angle of contact of a drop of water deposited on the specimens. The results appear in Table 3.

TABLE 3

| | Specimen 7 | Specimen 8 | Specimen 9 |
|---|---|---|---|
| Prior to treatment with thiol | 19.8 ± 0.2 | 17.3 ± 0.7 | 20.3 ± 0.9 |
| After treatment with thiol | 20.2 ± 0.5 | 16.8 ± 1.0 | 19.3 ± 1.3 |

As may be noted, treatment of the silicon substrates with the thiol solution leaves their angle of contact unchanged. This demonstrates that thiol does not bind to silicon surfaces, the angle of contact of which thus remains unchanged. Consequently, in the production of a nozzle plate according to the method described, the deposition of the thiol by dipping in a thiol solution will exclusively regard the areas in which the metal layer has been previously deposited and not the free silicon surfaces, such as for example the nozzles of the nozzle plate.

The invention claimed is:

1. A method comprising:

a) forming directly, on at least one surface of a semiconductor material substrate, a metal layer of a material selected from the group consisting of noble metals, coining metals, oxides thereof and alloys thereof, wherein the semiconductor material substrate has at least one outlet channel formed through an opposite surface from the surface on which the metal layer is formed;

b) forming openings on said semiconductor material substrate in an area corresponding to and in fluid communication with said at least one outlet channel, the openings being nozzles arranged in the semiconductor material substrate, which provides a nozzle plate; and c) forming an antiwetting coating on the nozzle plate by applying on said metal layer a layer of a thiol of formula R—SH, wherein R is a linear alkyl chain having from 3 to 20 carbon atoms and, optionally, at least one hetero-atom, wherein the antiwetting coating is confined to the metal layer on the nozzle plate and does not extend into the nozzles.

2. The method of claim 1 wherein the nozzle plate is a part of an ink-jet printer and the at least one outlet channel is connected to an ink reservoir.

3. The method of claim 1 wherein forming the openings is carried out after forming the metal layer.

4. The method according to claim 1 wherein said metal layer includes silver, gold, copper, palladium, platinum, mercury, ruthenium, nickel, titanium, indium, zinc, oxides or alloys thereof.

5. The method of claim 1 wherein the thiol is dodecanethiol.

6. An integrated ink-jet printhead, comprising:

a body of semiconductor material housing an ink chamber, an inlet channel, and an outlet channel; and a nozzle plate extending over the body, wherein the nozzle plate is constituted by a semiconductor material substrate coated with an antiwetting coating having a metal layer and a thiol layer, and wherein the metal layer directly contacts the semiconductor material substrate of the nozzle plate and the thiol layer overlies the metal layer, wherein the thiol layer is confined to the metal layer.

7. The integrated ink-jet printhead of claim 6 wherein the thiol layer includes a plurality of thiol of the formula R—SH, wherein R is a linear alkyl chain having from 3 to 20 carbon atoms and, optionally, at least one hetero-atom.

8. The integrated ink-jet printhead of claim 7 wherein the thiol is dodecanethiol.

9. The integrated ink-jet printhead of claim 6 wherein the metal layer includes silver, gold, copper, palladium, platinum, mercury, ruthenium, nickel, titanium, indium, zinc, oxides or alloys thereof.

10. The method of claim 6 wherein the metal layer is 20 nm thick.

* * * * *